United States Patent
Shue et al.

(10) Patent No.: US 6,825,520 B1
(45) Date of Patent: Nov. 30, 2004

(54) CAPACITOR WITH A ROUGHENED SILICIDE LAYER

(75) Inventors: Shau-Lin Shue, Hsinchu (TW); Cheng-Yeh Shih, Hsin-chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/534,550

(22) Filed: Mar. 27, 2000

Related U.S. Application Data

(62) Division of application No. 09/027,761, filed on Feb. 23, 1998, now Pat. No. 6,143,617.

(51) Int. Cl.⁷ .............................................. H01L 29/94
(52) U.S. Cl. ...................................... 257/309; 257/307
(58) Field of Search ................................. 257/306, 307, 257/308, 304, 310

(56) References Cited

U.S. PATENT DOCUMENTS

| | | | |
|---|---|---|---|
| 5,053,917 A | 10/1991 | Miyasaka et al. | 361/321 |
| 5,110,752 A * | 5/1992 | Lu | 437/47 |
| 5,272,367 A * | 12/1993 | Dennison et al. | 257/306 |
| 5,381,302 A | 1/1995 | Sandhu et al. | 361/305 |
| 5,466,626 A | 11/1995 | Armacost et al. | 437/60 |
| 5,480,826 A | 1/1996 | Sugahara | 437/52 |
| 5,563,090 A * | 10/1996 | Lee et al. | 437/60 |
| 5,597,754 A | 1/1997 | Lou et al. | 437/52 |
| 5,656,529 A * | 8/1997 | Fukase | 438/398 |
| 5,907,772 A * | 5/1999 | Iwasaki | 438/253 |
| 5,962,886 A * | 10/1999 | Mori et al. | 257/309 |
| 5,966,627 A * | 10/1999 | Brady et al. | 438/542 |
| 6,028,002 A * | 2/2000 | Thakur | 438/647 |
| 6,124,614 A * | 9/2000 | Ryum et al. | 257/347 |
| 6,163,046 A * | 12/2000 | Okumura et al. | 257/306 |
| 6,177,716 B1 * | 1/2001 | Clark | 257/532 |
| 6,407,420 B1 * | 6/2002 | Yamanaka et al. | 257/296 |
| 6,417,565 B1 * | 7/2002 | Komatsu | 257/750 |

* cited by examiner

Primary Examiner—Eddie C. Lee
Assistant Examiner—Douglas W. Owens
(74) Attorney, Agent, or Firm—George O. Saile; Stephen B. Ackerman

(57) ABSTRACT

A process for creating a storage node electrode, for a DRAM cell, exhibiting increased surface area resulting from the formation of an agglomerated metal silicide layer, on the top surface of the storage node electrode, has been developed. The process features creating a polysilicon, storage node electrode shape, followed by the formation of an overlying, agglomerated titanium disilicide layer. The agglomerated titanium disilicide layer is formed from a RTA procedure, applied to a smooth titanium disilicide layer, located on the polysilicon, storage node electrode.

2 Claims, 5 Drawing Sheets

CAPACITOR WITH A ROUGHENED SILICIDE LAYER

This is a division of patent application Ser. No. 09/027,761, filing date Feb. 23, 1998 now U.S. Pat. No. 6,143,617. A Novel Composite Capacitor Electrode For A Dram Cell, assigned to the same assignee as the present invention.

BACKGROUND OF THE INVENTION (1) Field of the Invention

This invention relates to methods used to create semiconductor memory devices, and more specifically to a method used to create a capacitor structure, for a dynamic random access memory, (DRAM), device.

(2) Description of Prior Art

The semiconductor industry is continually striving to increase the density of DRAM chips, while still attempting to maintain, or increase the performance of the DRAM devices. The decreasing dimensions used to obtain high density DRAM devices, have resulted in difficulties in maintaining, or increasing the capacitance, for the high density DRAM devices. The capacitance of a stacked capacitor structure is positively influenced by decreasing the thickness of the dielectric layer, residing between conductive capacitor plates. Capacitance may also be increased by increasing the area of the capacitor. However decreasing the already thin dielectric layers, now used for DRAM capacitors, can lead to yield and reliability concerns, while stacked capacitor structures, formed in an area overlying transfer gate transistors, are now limited in dimension by the shrinking size of the underlying transfer gate transistor, thus limiting available capacitor area.

An approach used to increase stacked capacitor area, without increasing the length and width of the storage node electrode, of the stacked capacitor structure, has been the use of a roughened surface, storage node electrode. The roughened surface, storage node electrode, comprised of concave and convex features, results in an increase in storage node electrode surface area, when compared to flat surface, storage node electrode counterparts. One method used to create roughened surface, storage node electrodes, has been the use of hemi-spherical grain (HSG), silicon for the upper layer of the storage node electrode. Lou, et al, in U.S. Pat. No. 5,597,754, describe a process for forming an HSG, silicon layer on an underlying polysilicon layer, and patterning these layers to form the increased surface area, storage node electrode, for the capacitor structure of DRAM device. However the HSG silicon solution can be difficult to control, since the amount of HSG silicon roughness is obtainable only in a narrow range of deposition conditions, such as temperature and pressure. This invention will show an alternative to the HSG silicon solution, in which the surface roughness, of the storage node electrode, is established using a composite layer of titanium disilicide, on a polysilicon layer. The desired roughness is accomplished via specific heat treatment processes, resulting in agglomeration of the titanium disilicide layer, producing the desired roughened surface. Prior art, such as Armacost et al, in U.S. Pat. No. 5,466,626, suggest the use of agglomerated titanium disilicide as an etch mask, to create crevices, or a roughened surface, in an underlying polysilicon layer, with the titanium disilicide layer, subsequently removed. This invention however will use the agglomerated layer as a critical component of the composite layered, storage node electrode.

SUMMARY OF THE INVENTION

It is an object of this invention to increase the surface area of a storage node electrode of a capacitor structure, used for a DRAM device.

It is another object of this invention to form a storage node electrode-comprised of a composite layer of metal suicide on a polysilicon layer.

It is still another object of this invention to increase the surface area of the storage node electrode by converting a smooth surface of the metal silicide layer, to a roughened surface, via an agglomeration process.

In accordance with the present invention a process is described for forming a composite layered, storage node electrode, for a DRAM device, in which the surface area of the storage node electrode is increased as a result of the use of an agglomerated metal silicide layer, used as the upper layer of the composite layered, storage node electrode. An underlying transfer gate transistor is provided with a storage node contact hole, opened in an insulator layer, exposing a source and drain region of the underlying transfer gate transistor. A conductive contact plug is formed in the storage node contact hole followed by the deposition of a first polysilicon layer, and of an overlying insulator layer. A mesa shape, comprised of the insulator layer, and of the first polysilicon layer, is formed on the underlying composite insulator layer, and contacting the top surface of the conductive contact plug, in the storage node contact hole. A second polysilicon layer is deposited and subjected to an anisotropic reactive ion etch, (RIE), procedure, resulting in second polysilicon layer spacers, formed on the sides of the mesa shape. Removal of the insulator layer, exposed in the mesa shape, results in a polysilicon cylindrical profile, comprised of a bottom polysilicon shape, formed from the first polysilicon layer, and vertical polysilicon shapes, formed from the second polysilicon layer. A metal layer is next deposited, and annealed to convert the metal layer, to a metal silicide layer, in regions in which the metal layer interfaced the polysilicon cylindrical profile, followed by selective removal of the unreacted metal layer. A second anneal is used to convert the smooth surfaced, metal silicide layer, on the underlying polysilicon cylindrical profile, to a roughened surface, metal silicide layer, resulting in a storage node electrode, with increased surface area. The formation of a dielectric layer, on the roughened surface metal silicide layer, followed by the formation of an overlying polysilicon electrode, complete the fabrication of the DRAM capacitor structure, featuring increased surface area, as a result of a roughened surface, storage node electrode.

BRIEF DESCRIPTION OF THE DRAWINGS

The object and other advantages of this invention are best described in the preferred embodiment with reference to the attached drawings that include.

DESCRIPTION OF THE PREFERRED EMBODIMENT

The process used to create a storage node electrode, for a DRAM cell, in which the surface area of the storage node electrode is increased via use of an agglomerated, metal silicide layer, will now be described in detail. The storage node electrode, comprised of an agglomerated, metal silicide layer, and used as part of a capacitor structure for a DRAM cell, will be applied to a DRAM cell featuring an N channel, transfer gate transistor. However this invention can be easily implemented using a DRAM cell with a P channel, transfer gate transistor. In addition, this invention illustrates a cylindrical shaped, capacitor structure, for the DRAM cell. However it should be noted that this invention, the formation of an agglomerated, metal silicide layer, for a storage node electrode, can be applied to any desired storage node electrode shape.

Figure 1:
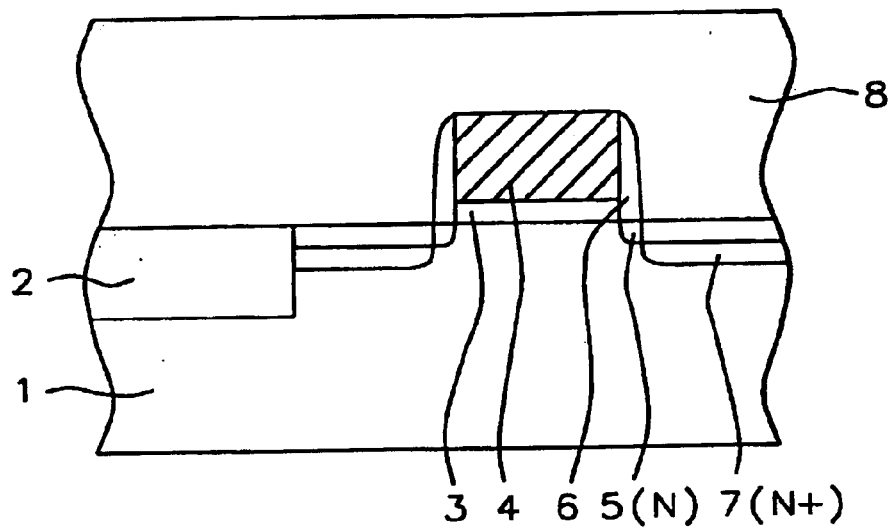
FIGS. 1–10, which schematically, in cross-sectional style, describe the process of forming a storage node electrode, for a DRAM cell, in which the surface of the storage node electrode is comprised of an agglomerated, metal silicide layer.

FIG. 1, schematically describes, in cross-sectional style, the formation of the transfer gate transistor, used for the DRAM cell, that will subsequently accept an overlying stacked capacitor structure, featuring a storage node electrode, comprised of an agglomerated, metal silicide layer. A P type, semiconductor substrate 1, comprised of single crystalline silicon, with a <100> crystallographic orientation, is used. A shallow trench isolation, (STI), region 2, is formed in semiconductor substrate 1, to a depth between about 3000 to 5000 Angstroms. STI region 2, is formed via initially creating a shallow trench in semiconductor substrate 1, using conventional photolithographic and reactive ion etching, (RIE), procedures, using Cl, as an etchant, and after removal of the patterning photoresist shape, filling the shallow trench with an insulator layer, such as $SiO_2$. Removal of unwanted insulator layer is accomplished using either an anisotropic RIE procedure, or a chemical mechanical polishing procedure, (CMP), resulting in the insulator filled, STI region 2, shown schematically in FIG. 1.

A gate insulator layer 3, of silicon dioxide, is thermally grown, followed by the deposition of a polysilicon layer, accomplished via a low pressure chemical vapor deposition, (LPCVD), procedure. The polysilicon layer can be doped during an in situ deposition procedure, via the addition of arsine or phosphine, to a silane ambient, or the-polysilicon layer can be deposited intrinsically and doped via ion implantation of either arsenic or phosphorous. Conventional photolithographic and RIE procedures, using $Cl_2$ as an etchant, are used to create polysilicon gate structure 4, shown schematically in FIG. 1. After photoresist removal, accomplished via plasma oxygen ashing and careful wet cleans, a lightly doped source and drain region 5, is created via an ion implantation procedure of arsenic or phosphorous. Insulator spacers 6, are formed on the sides of polysilicon gate structure 4, via initially depositing a silicon oxide, or a silicon nitride layer, via an LPCVD or a plasma enhanced chemical vapor deposition, (PECVD), procedure, followed by an anisotropic RIE procedure, using $CHF_3$ as an etchant. A heavily doped source and drain region 7, is than formed, again via ion implantation procedures, again using arsenic or phosphorous. The result of these procedures is schematically shown in FIG. 1. An insulator layer 8, comprised of silicon oxide, is deposited using LPCVD or PECVD procedures. A CMP procedure is used for planarization purposes, creating a smooth top surface for insulator layer 8, shown schematically in FIG. 1.

Figure 2:
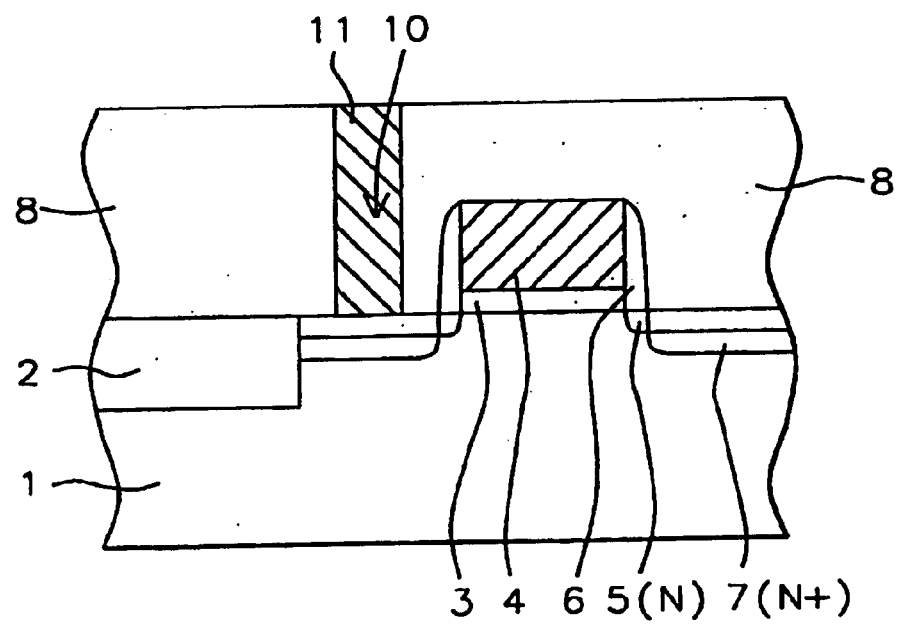

A storage node contact hole 10, is formed in insulator layer 8, exposing the top surface of heavily doped source and drain region 7. Storage node contact hole 10, is formed using conventional photolithographic and RIE procedures, using $CHF_3$ as an etchant. After removal of the photoresist shape used as a mask for storage node contact hole formation, via plasma oxygen ashing and careful wet cleans, a conductive plug 11, is formed in storage node contact hole 10. Conductive plug 11, can be tungsten, tungsten silicide, or doped polysilicon. The conductive plug is formed via deposition of tungsten, tungsten silicide, or doped polysilicon, using LPCVD procedures, followed by removal of unwanted material, via a selective RIE procedure, using $Cl_2$ as an etchant, or via a CMP procedure, creating conductive plug 11, in storage node contact hole 10, schematically shown in FIG. 2.

Figure 3:
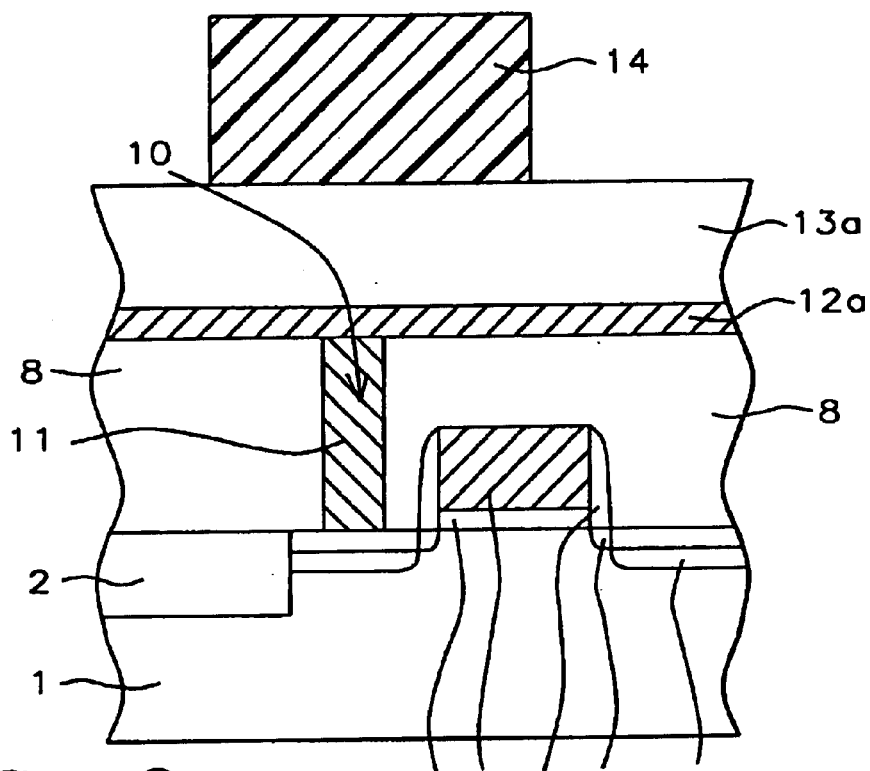
Figure 4:
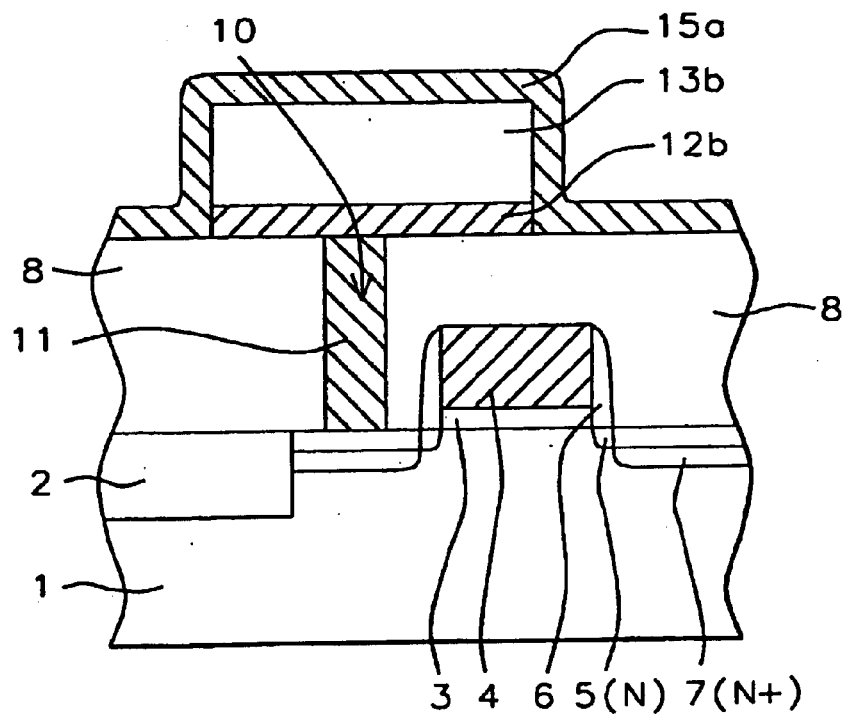

A polysilicon layer 12a, is next deposited via LPCVD procedures. Polysilicon layer 12a, is doped either during an in situ deposition procedure, via the addition of arsine, or phosphine, to a silane ambient, or polysilicon layer 12a can be deposited intrinsically and doped via ion implantation procedures, using arsenic or phosphorous. An insulator layer 13a, comprised of either boro-phosphosilicate glass, (BPSG), or phosphosilicate glass, (PSG), is deposited on polysilicon layer 12a, via PECVD or LPCVD procedures. A photoresist shape 14, shown schematically in FIG. 3, is formed on insulator 13a. A selective, anisotropic RIE procedure, using $CHF_3$ as an etchant for insulator layer 13a, and using $Cl_2$ as an etchant for polysilicon layer 12a, is used to create insulator mesa 13b, and polysilicon shape 12b, directly underlying insulator mesa 13b. After removal of photoresist shape 14, via plasma oxygen ashing and careful wet cleans, polysilicon layer 15a, is deposited, via LPCVD procedures, using an N type in situ doping procedure, to a thickness between about 500 to 2000 Angstroms. This is schematically illustrated FIG. 4.

Figure 5:
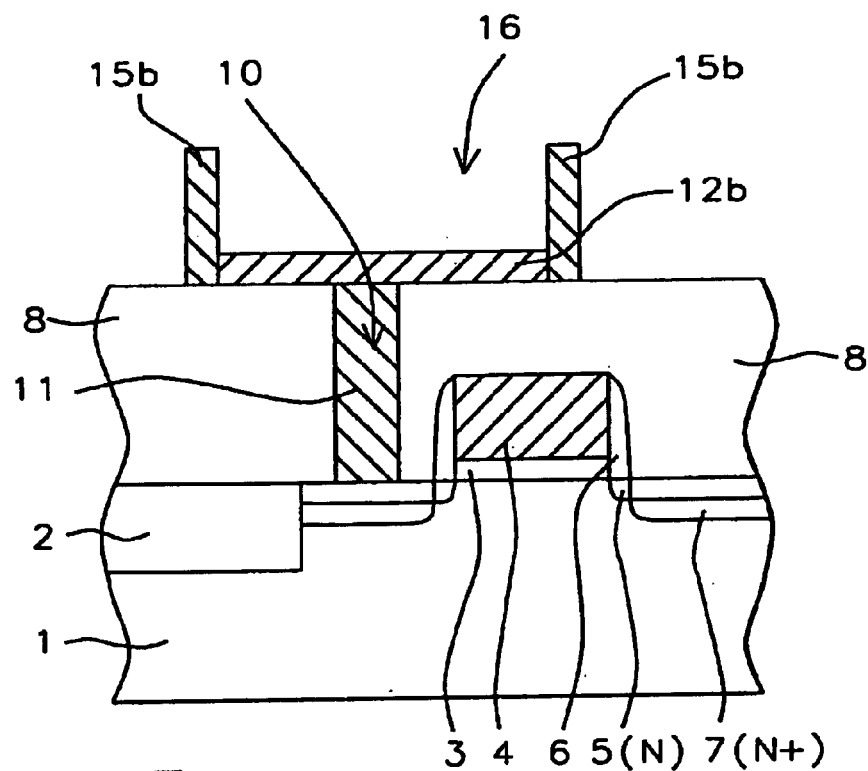

An anisotropic RIE procedure, using $Cl_2$ as an etchant, is next employed to form polysilicon spacers 15b, on the sides of insulator mesa 13b, and on the sides of polysilicon shape 12b. Insulator mesa 13b, in then subjected to a vapor HF procedure, completely removing insulator mesa 13b, and resulting in a polysilicon, storage node electrode shape, comprised of vertical polysilicon spacers 15b, connected at the bottom to polysilicon shape 12b, with opening 16, resulting from the removal of insulator mesa 13b. This is schematically shown in FIG. 5. The vapor HF removal procedure provides a faster removal rate for BPSG or PSG, than for silicon oxide layer 9. Therefore insulator mesa 13b, can be completely removed without attacking insulator layer 8.

Figure 6:
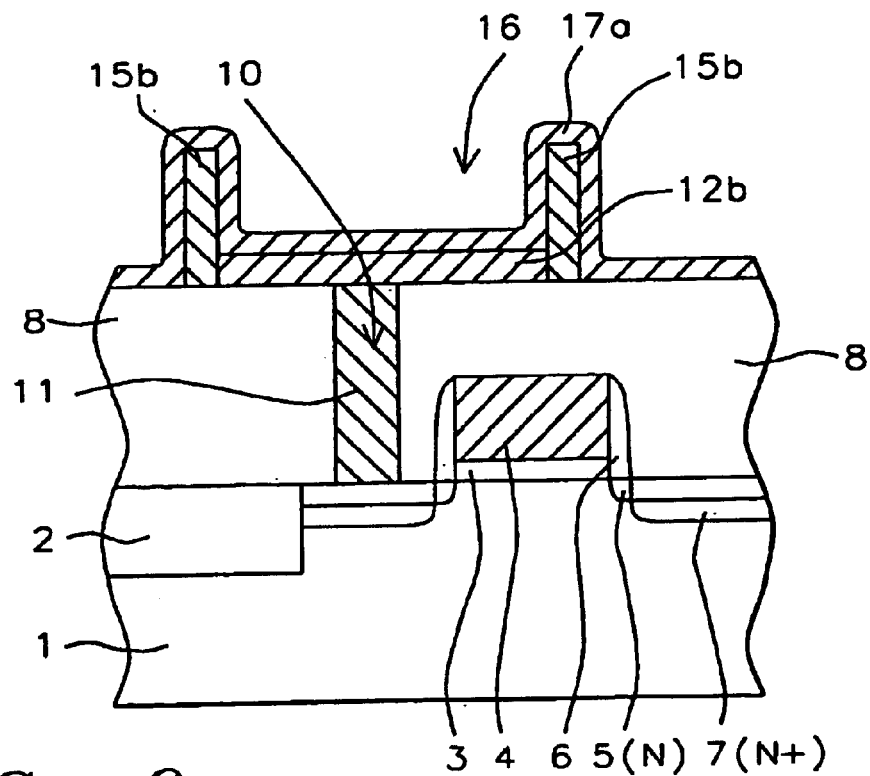
Figure 7:
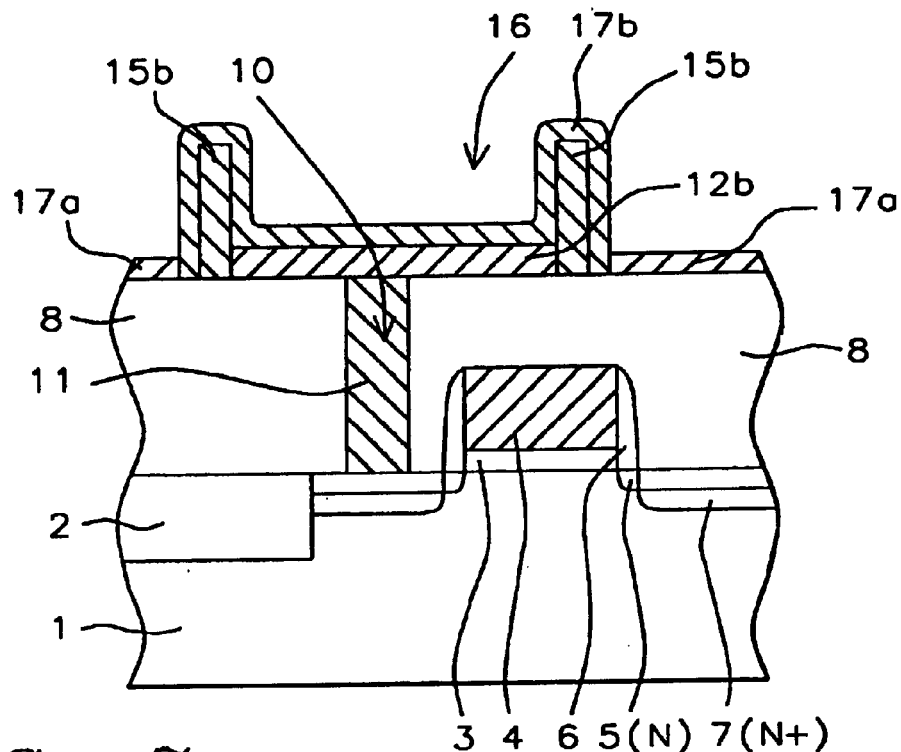
Figure 8:
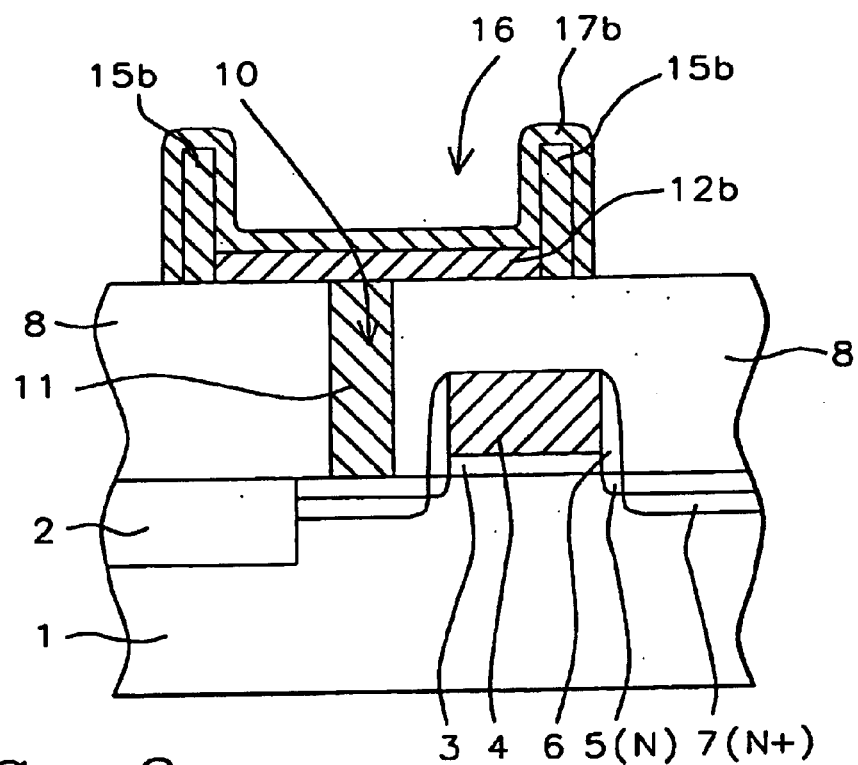
Figure 9:
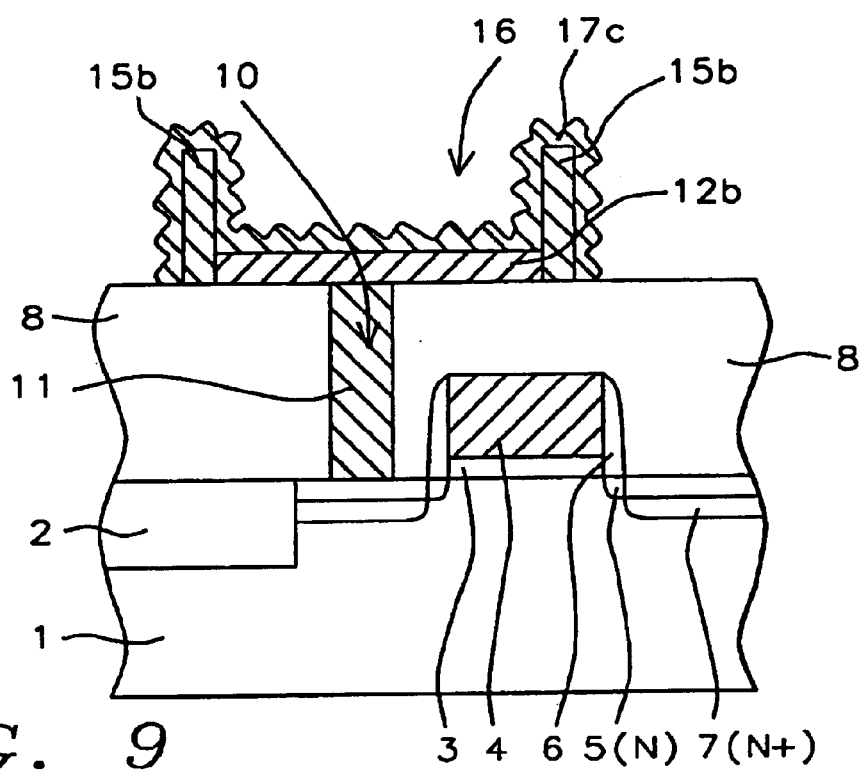

A metal layer 17a, of either titanium, cobalt, nickel, or platinum, is deposited via an r.f. sputtering procedure, to a thickness between about 100 to 500 Angstroms. This is shown schematically in FIG. 6. A first rapid thermal anneal, (RTA), procedure is performed, at a temperature between about 400 to 750° C., for between about 30 to 90 sec., to convert metal layer 17a, to metal silicide layer 17b, such as titanium disilicide, cobalt silicide, nickel silicide, or platinum silicide, in regions in which metal layer 17a, overlaid polysilicon spacers 15b, and polysilicon shape 12b. Metal layer 17a, such as titanium, cobalt, nickel, or platinum remained unreacted in regions overlying insulator layer 8. This is schematically shown in FIG. 7. Unreacted metal layer 17a, such as titanium, cobalt, nickel, or platinum, is then selectively removed using a sulfuric-hydrogen peroxide solution. Metal silicide layer 17b, is not removed during this wet procedure. This is schematically illustrated in FIG. 8. A second RTA procedure is next used, to convert the smooth metal silicide layer 17b, to an agglomerated metal silicide layer 17c. The RTA procedure used to create the roughened surface, agglomerated metal silicide layer, is performed at a temperature between about 800 to 1000° C., for a time between about 30 to 90 sec. The result of this procedure is schematically shown in FIG. 9. The roughened surface of agglomerated metal silicide layer 17c, used as the top layer of a storage node structure of a DRAM device, will result in increased surface area, when compared to counterparts, fabricated with smooth surfaces. The use of agglomerated metal silicide layers, such as titanium silicide, cobalt silicide, nickel silicide, and platinum silicide can be used.

Figure 10:
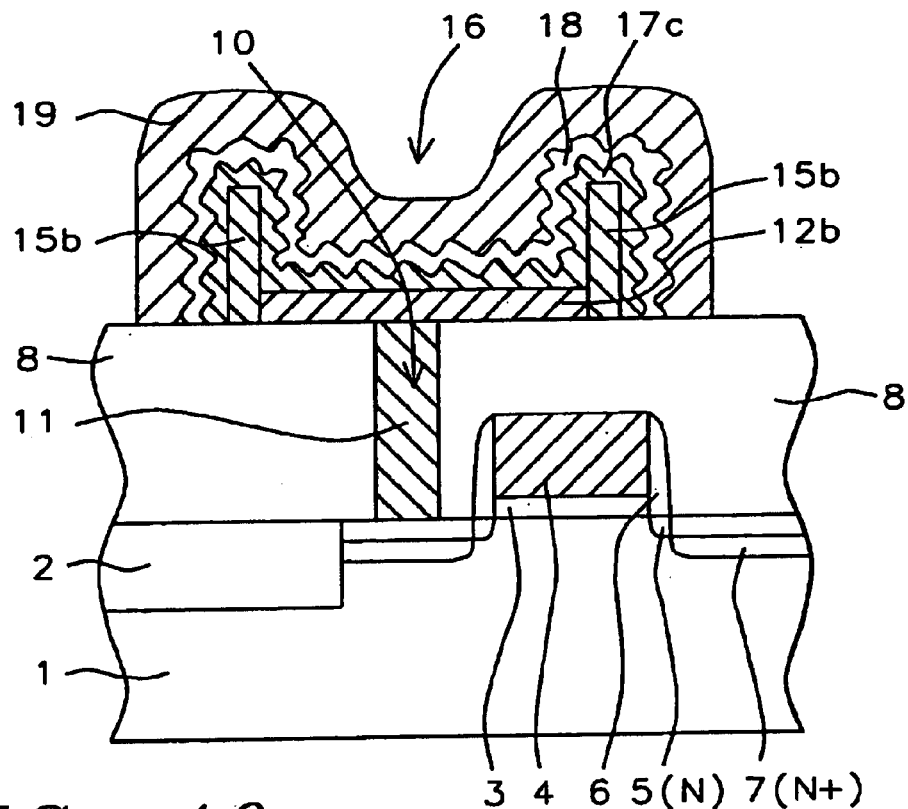

The process used to create the capacitor structure, comprised of a storage node electrode, featuring increased surface area resulting from the roughened surface titanium disilicide layer, continues with the formation of the capacitor dielectric layer 18. Capacitor dielectric layer 18, can be a $Ta_2O_5$, layer, deposited using r.f. sputtering procedures. Capacitor dielectric layer 18, can also be a titanium nitride, silicon nitride, or an ONO, (silicon oxide—silicon nitride—silicon oxide), layer. A polysilicon layer is next deposited, via LPCVD procedures, and doped during an in situ deposition procedure, or doped using an ion implantation procedure. Conventional photolithographic and RIE procedures, are used to pattern the polysilicon layer, creating upper polysilicon electrode 19, for the capacitor structure of the DRAM cell. This is schematically displayed in FIG. 10.

While this invention has been particularly shown and described with reference to, the preferred embodiments thereof, it will be understood by those skilled in the art that various changes in form and details may be made without departing from the spirit and scope of this invention.

What is claimed is:

1. A cylindrical shaped, capacitor structure, featuring a cylindrical storage node structure comprised of an underlying, uniformly doped, cylindrical polysilicon shape and an overlying agglomerated metal silicide layer, wherein said agglomerated metal silicide layer is located only on exposed surfaces of said cylindrical polysilicon shape, comprising:

said cylindrical polysilicon shape comprised of a bottom polysilicon shape located on a first section of a top surface of an underlying planar, insulator layer, with said bottom polysilicon shape overlying and contacting a top surface of a plug structure which in turn is located in an opening in said insulator layer, and with said cylindrical polysilicon shape comprised of uniformly doped, vertical polysilicon shapes, located overlying second sections of said planar, insulator layer, with bottom portions of said vertical polysilicon shapes butting edges of said bottom polysilicon shape;

said agglomerated metal silicide layer with a roughened top surface, located only on exposed portions of said cylindrical polysilicon shape and not located on any other surface of said cylindrical shaped, capacitor structure or on any surface of said planar insulator layer, with said agglomerated metal silicide on top surface of said bottom polysilicon shape, and on all surfaces of uniformly doped, said vertical polysilicon shapes, resulting in said cylindrical shape storage node structure comprised with said agglomerated metal silicide layer located only on said cylindrical polysilicon shape;

a capacitor dielectric layer located only on the exposed surfaces of said cylindrical polysilicon shape with said capacitor dielectric layer located only overlying said agglomerated metal silicide layer; and an upper electrode, covering said capacitor dielectric layer.

2. The cylindrical shaped, capacitor structure of claim 1, wherein said agglomerated metal silicide layer is selected from a group consisting of titanium silicide, cobalt silicide, nickel silicide, and platinum silicide.

* * * * *